(12) United States Patent
Coros et al.

(10) Patent No.: US 9,589,097 B2
(45) Date of Patent: Mar. 7, 2017

(54) MOTION-BASED DESIGN OF MECHANICAL OBJECTS

(71) Applicant: Disney Enterprises, Inc., Burbank, CA (US)

(72) Inventors: Stelian Coros, Zürich (CH); Bernhard Thomaszewski, Zürich (CH); Wojciech Matusik, Lexington, MA (US); Bernd Bickel, Zürich (CH); Shinjiro Sueda, Lynn, MA (US)

(73) Assignee: Disney Enterprises, Inc., Burbank, CA (US)

( * ) Notice: Subject to any disclaimer, the term of this patent is extended or adjusted under 35 U.S.C. 154(b) by 630 days.

(21) Appl. No.: 13/972,604

(22) Filed: Aug. 21, 2013

(65) Prior Publication Data
US 2014/0316757 A1    Oct. 23, 2014

Related U.S. Application Data

(60) Provisional application No. 61/815,173, filed on Apr. 23, 2013.

(51) Int. Cl.
*G06F 7/60* (2006.01)
*G06F 17/50* (2006.01)

(52) U.S. Cl.
CPC .................. *G06F 17/5086* (2013.01)

(58) Field of Classification Search
CPC ................................... G06F 17/5086
USPC ................................................ 703/2
See application file for complete search history.

(56) References Cited

U.S. PATENT DOCUMENTS

2008/0015727 A1*  1/2008  Dunne ............... A61B 5/4547
                                                    700/118
2010/0299145 A1* 11/2010  Nakadai ............ G10L 21/0208
                                                    704/233

* cited by examiner

*Primary Examiner* — Saif Alhija
(74) *Attorney, Agent, or Firm* — Farjami & Farjami LLP

(57) ABSTRACT

There is provided a motion-based design system and a method for use in producing a motion-based design of a mechanical object. In one implementation, such a method includes identifying a motion curve associated with a movement by an articulated structure corresponding to the mechanical object, and mapping the motion curve to a mechanical sub-assembly. The mapping is performed based on a previously characterized trajectory of the mechanical sub-assembly and the similarity of that trajectory to the motion curve. The method also includes utilizing the first mechanical sub-assembly to substantially replicate the motion curve.

27 Claims, 5 Drawing Sheets

MOTION-BASED DESIGN OF MECHANICAL OBJECTS

RELATED APPLICATIONS

The present application claims the benefit of and priority to a Provisional Patent Application Ser. No. 61/815,173, filed Apr. 23, 2013, and titled "Computational Design of Mechanical Automata," which is hereby incorporated fully by reference into the present application.

BACKGROUND

Advances in computer technology and software have made possible the creation of richly featured virtual characters capable of a wide range of complex movements. However, for mechanical characters and mechanical objects in general, motion is typically determined by physical assemblies of gears and linkages, making the design of mechanical objects capable of sophisticated, detailed movement a considerable challenge.

Unlike the technology supporting the creation of virtual characters, conventional design technology for producing mechanical objects has advanced relatively slowly and continues to require the participation of expert designers and engineers. Despite the high degree of technical expertise typically employed, the conventional design process for mechanical objects remains largely one of trial and error, often requiring many iterations to produce an acceptable product. Due to the cost associated with such an expertise intensive iterative design approach, and to the greatly increased iteration times associated with complex mechanical designs, mechanical objects such as mechanical characters tend to be limited in complexity. The unfortunate result of such limited complexity is that the range of possible movements by mechanical objects, as well as the creative freedom of their designers, is constrained.

SUMMARY

There are provided systems and methods for performing motion-based design of mechanical objects, substantially as shown in and/or described in connection with at least one of the figures, and as set forth more completely in the claims.

DETAILED DESCRIPTION

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As explained above, conventional design technology for producing mechanical objects has advanced relatively slowly, continuing to require the participation of expert designers and engineers and often proceeding by trial and error. Due to the cost associated with such an expertise intensive iterative design approach, mechanical designs tend to be limited in complexity and provide the mechanical objects produced from those designs only a limited range of possible movements. The present application discloses an improved mechanical design solution that adopts a motion-based computational design approach for producing mechanical objects capable of relatively complex and sophisticated movement. The present solution is interactive and highly intuitive, and in some implementations may enable a substantially non-expert user, such as a lay person or consumer, to design mechanical objects capable of a wide range of movements.

As used in the present application, the expression "mechanical object" can refer to any physical collection of mechanical parts configured to engage in one or more predetermined movements. In some implementations, a mechanical object may take the form of a mechanical character representative of an animated being, such as a humanoid character, animal character, or fantasy life form character, for example. In other implementations, a mechanical object may correspond to an inanimate mechanism, such as a vehicle or robot, for example. In yet other implementations, a mechanical object may correspond to a hybrid character having both animated and inanimate features, such as a cybernetic organism (cyborg), for example.

As noted above, the present motion-based design solution may be utilized by non-expert users as well as expert designers and engineers. When utilized by expert designers and engineers, for example, the present motion-based design solution may be used to produce large, complex, mechanical objects, such as animatronic characters and/or robots encountered in a theme park or other recreational or entertainment venue. When utilized by non-expert users, such as a theme park visitor or other type of consumer, for example, the present motion-based design solution may be used to produce smaller mechanical objects, such as consumer products or commemorative items that the non-expert user may purchase or otherwise acquire.

Figure 1:
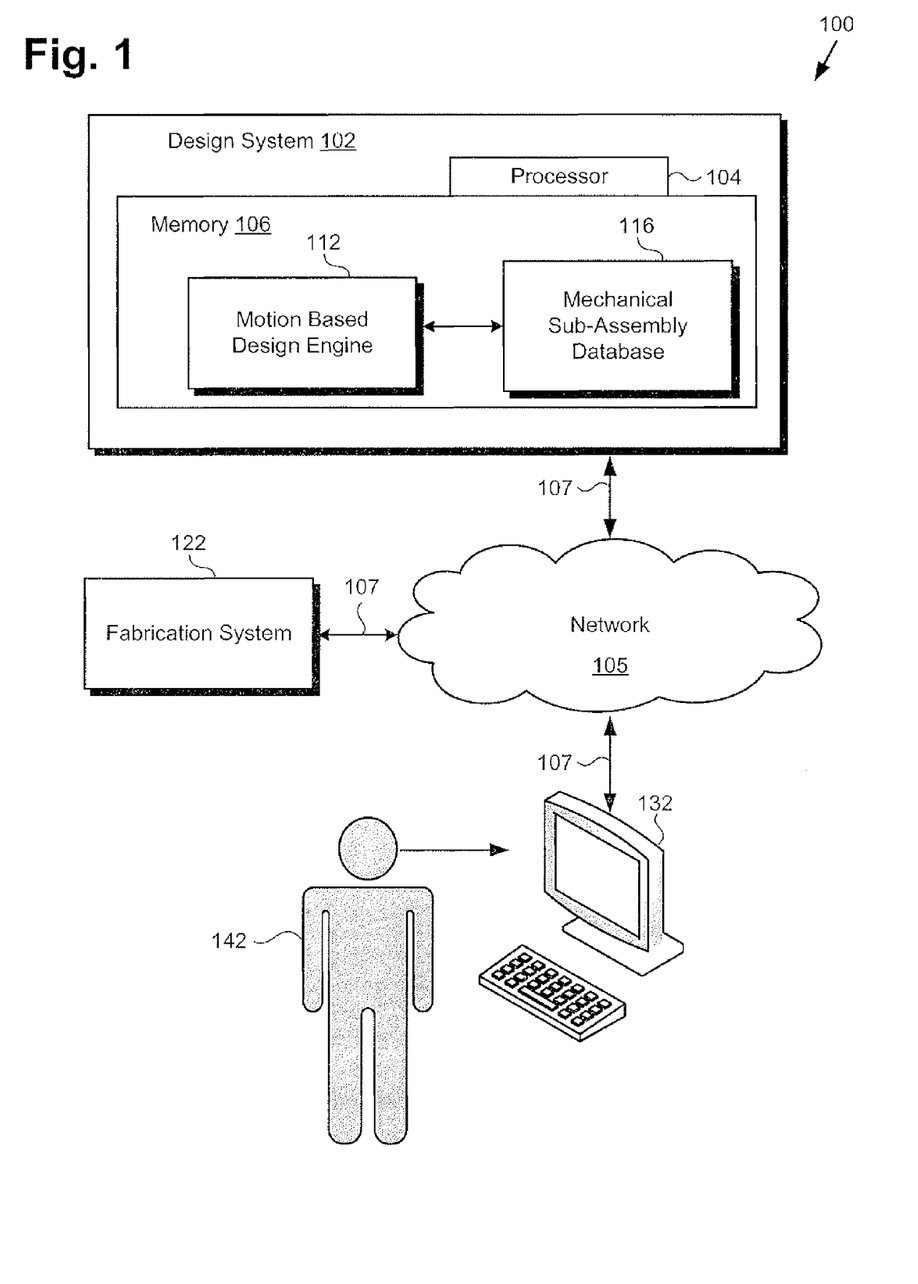
FIG. 1 shows a diagram of an exemplary design system configured to produce a motion-based design of a mechanical object, according to one implementation.

FIG. 1 shows a diagram of a design system configured to produce a motion-based design of a mechanical object, according to one implementation. As shown in FIG. 1, design environment 100 includes design system 102, communications network 105, fabrication system 122, design terminal 132, and consumer or user 142 utilizing design terminal 132 (hereinafter "designer 142"). As further shown in FIG. 1, design system 102 includes design system processor 104, and design system memory 106 storing subassembly database 116 and motion-based design engine 112. Also shown in FIG. 1 are network communication links 107 interactively connecting design terminal 132, fabrication system 122, and design system 102 via communications network 105.

It is noted that although FIG. 1 depicts mechanical sub-assembly database 116 and motion-based design engine 112 as being mutually co-located in design system memory 106, that representation is merely provided as an aid to conceptual clarity. More generally, design system 102 may include one or more design servers, which may be co-located, or may form an interactively linked but distributed system. As a result, design system processor 104 and design system memory 106 may correspond to distributed processor and memory resources within design system 102. Thus, it is to be understood that mechanical sub-assembly database 116 and motion-based design engine 112 may be stored remotely from on another within the distributed memory resources of design system 102.

It is further noted that in some implementations, design system 102 may not include mechanical sub-assembly database 116. In those implementations, mechanical sub-assembly database 116 may be an external resource for design system 102, such as a third party resource, for example, accessible over communications network 105. Moreover, in some implementations, design system 102 may include fabrication system 122, which may comprise a three-dimensional (3D) printer for example, configured to fabricate a mechanical object using a motion-based design produced by motion-based design engine 112.

According to the implementation shown by FIG. 1, designer 142 may utilize design terminal 132 to interact with motion-based design engine 112 of design system 102, over communications network 105. In one such implementation, design system 102 may correspond to one or more web servers, accessible over a packet network such as the Internet, for example. Alternatively, design system 102 may correspond to one or more design servers supporting a local area network (LAN), or included in another type of limited distribution network.

Although design terminal 132 is shown as a personal computer (PC) in FIG. 1, that representation is also provided merely as an example. In other implementations, design terminal 132 may be another type of mobile or stationary computing device or system. For example, design terminal 132 may take the form of a design kiosk in a theme park environment, or may be implemented as a tablet computer, or a mobile communication device such as a smartphone, for example.

As shown in FIG. 1, motion-based design engine 112, under the control of design system processor 104, may receive one or more inputs from designer 142 over communications network 105. For example, and as will be described in greater detail below, motion-based design engine 112 may receive inputs enabling identification of one or more of an articulated structure corresponding to a mechanical object, an actuation point or points of the articulated structure, and a motion curve associated with movement by the articulated structure. According to the implementation shown in FIG. 1, motion-based design engine 112 is configured to utilize mechanical sub-assembly database 116 to map the received input, such as the motion curve associated with movement by the articulated structure, to a particular mechanical sub-assembly based on a previously characterized trajectory of the mechanical sub-assembly.

The mapping performed by motion-based design engine 112 may result in selection of a mechanical sub-assembly having a trajectory that only roughly corresponds to the target motion curve. However, in some implementations, the mechanical sub-assemblies available to motion-based design engine 112 may include one or more adjustable parameters for modifying the mechanical sub-assembly trajectory. In those implementations, motion-based design engine 112 may be configured to utilize a continuous optimization process to tune the one or more adjustable parameters of the selected mechanical sub-assembly to substantially replicate the target motion curve.

Motion-based design engine 112 may repeat the mapping and tuning operations for additional motion curves associated with movement by the articulated structure corresponding to the mechanical object being designed. When all mechanical sub-assemblies are selected and tuned, motion-based design engine 112 may perform a virtual assembly of the selected and tuned mechanical sub-assemblies to verify their operational compatibility, and may then simulate execution of the desired movement by the mechanical object under design. When a satisfactory motion-based design of the mechanical object is produced, design system 102 may send the motion-based design to fabrication system 122 for fabrication of the mechanical object.

Figure 2:
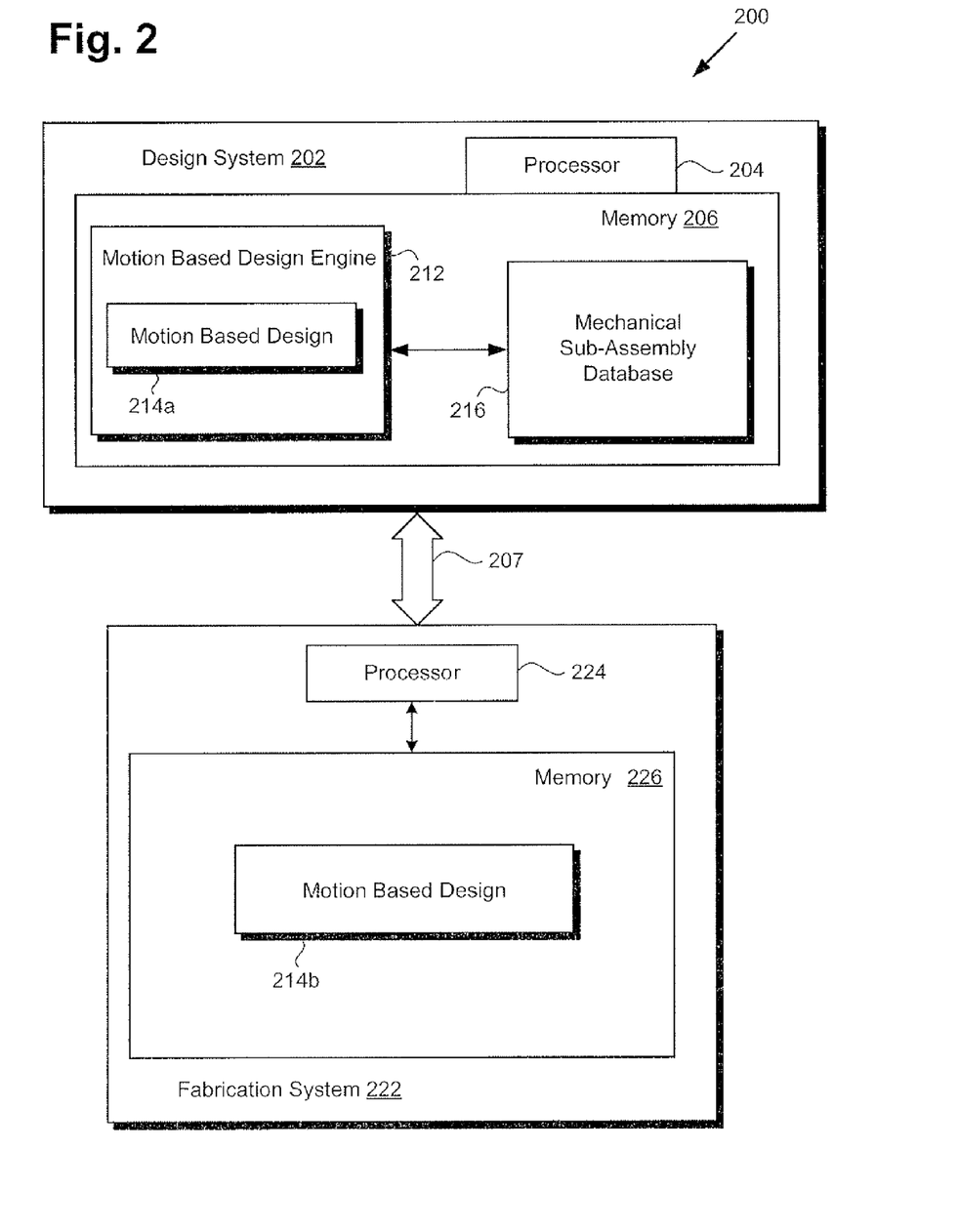
FIG. 2 shows another exemplary implementation of a design system configured to produce a motion-based design of a mechanical object.

Referring to FIG. 2, FIG. 2 shows another exemplary implementation of a design system configured to produce a motion-based design of a mechanical object. Design environment 200 includes design system 202 in communication with fabrication system 222 over network communication link 207. Design system 202 is shown to include design system processor 204, and design system memory 206 storing mechanical sub-assembly database 216 and motion-based design engine 212. Also shown in FIG. 2 is motion-based design 214a produced by motion-based design engine 212 and residing in design system memory 206.

Design system 202 including design system processor 204 and design system memory 206 corresponds to design system 102 including design system processor 104 and design system memory 106, in FIG. 1. Moreover, mechanical sub-assembly database 216, and motion-based design engine 212 producing motion-based design 214a, in FIG. 2, correspond respectively to mechanical sub-assembly database 116 and motion-based design engine 112, in FIG. 1.

In addition, fabrication system 222 and network communication link 207, in FIG. 2, correspond respectively to fabrication system 122 and any of network communications links 107, in FIG. 1. As shown in FIG. 2, fabrication system 222, which may comprise a 3D printer, for example, includes fabrication system processor 224 and fabrication system memory 226. Also shown in FIG. 2 is motion-based design 214b residing in fabrication system memory 226. According to the implementation shown in FIG. 2, the presence of motion-based design 214b in fabrication system memory 226 corresponds to its transmission to fabrication system 222 from design system 202 over network communication link 207. It is noted that network communication link 207 is shown as a two-way communication link to represent possible ongoing communication between fabrication system 222 and design system 202.

Fabrication system processor 224 may be the central processing unit for fabrication system 222, for example, in which role fabrication system processor 224 controls the operation of fabrication system 222. Fabrication system processor 224 may further manage use of motion-based design 214b to fabricate the mechanical object corresponding to motion-based design 214b. As noted above, in some implementations, fabrication system 222 may be included as a feature of design system 202.

Figure 3:
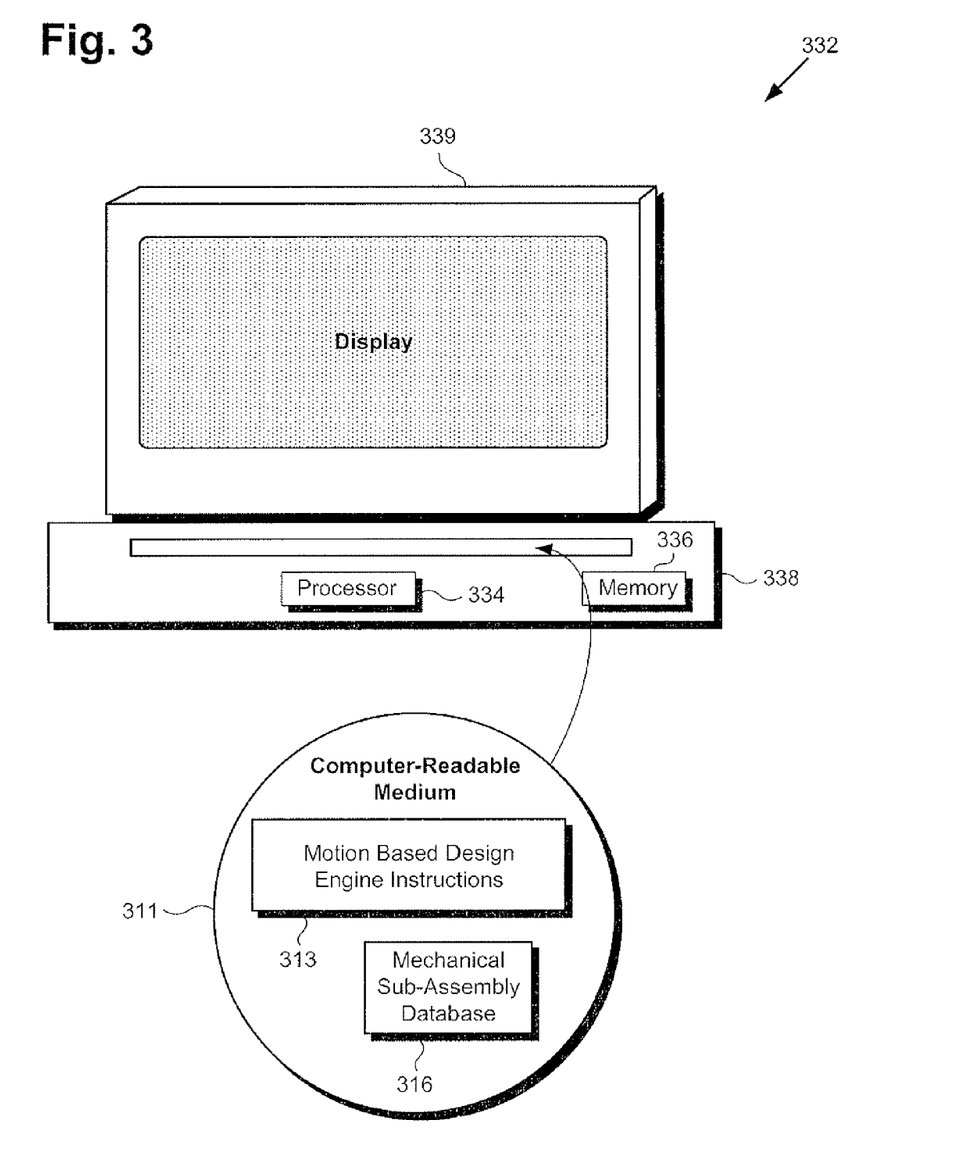
FIG. 3 shows an exemplary design terminal and a computer-readable medium including instructions enabling production of a motion-based design of a mechanical object, according to one implementation.

Moving now to FIG. 3, FIG. 3 shows an exemplary design terminal and a computer-readable medium including instructions enabling production of a motion-based design of a mechanical object, according to one implementation. Design terminal 332, in FIG. 3, includes computer 338 including processor 334 and memory 336, interactively linked to display 339. Also shown in FIG. 3 is computer-readable medium 311 having mechanical sub-assembly database 316 and motion-based design engine instructions 313 stored thereon. Design terminal 332 corresponds to design terminal 132, in FIG. 1.

The expression "computer-readable medium," as used in the present application, refers to any medium that provides instructions to processor 334 of computer 338. Thus, a computer-readable medium may correspond to various types of media, such as volatile media and non-volatile media, for example. Volatile media may include dynamic memory, such as dynamic random access memory (dynamic RAM), while non-volatile memory may include optical, magnetic, or electrostatic storage devices. Common forms of computer-readable media include, for example, an optical disc, RAM, programmable read-only memory (PROM), erasable PROM (EPROM), and FLASH memory.

According to the implementation shown by FIG. 3, computer-readable medium 311 provides motion-based design engine instructions 313 for execution by processor 334. Motion-based design engine instructions 313, when executed by processor 334, instantiate a motion-based design engine on design terminal 332 corresponding to motion-based design engine 112, in FIG. 1, and capable of performing all of the operations attributed to motion-based design engine 112 herein. It is noted that although FIG. 3 shows computer-readable medium 311 as including mechanical sub-assembly database 316, that depiction is merely by way of example. In other implementations, mechanical sub-assembly database 316 may not be present on computer-readable medium 311, but may be accessible to design terminal 332 over a communications network corresponding to communications network 105, in FIG. 1.

Figure 4:
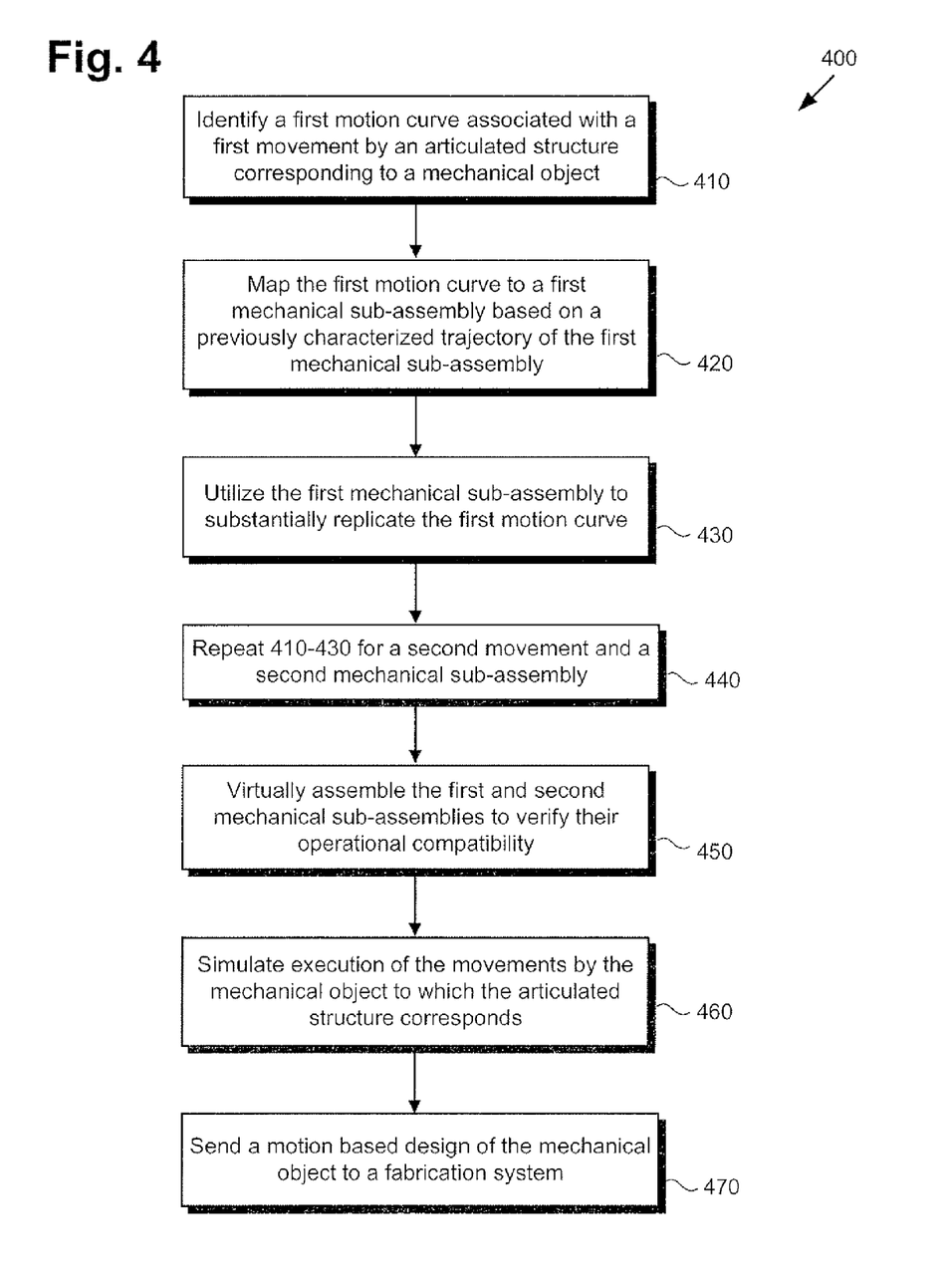
FIG. 4 is a flowchart presenting an exemplary method for use by a design system to produce a motion-based design of a mechanical object.
Figure 5:
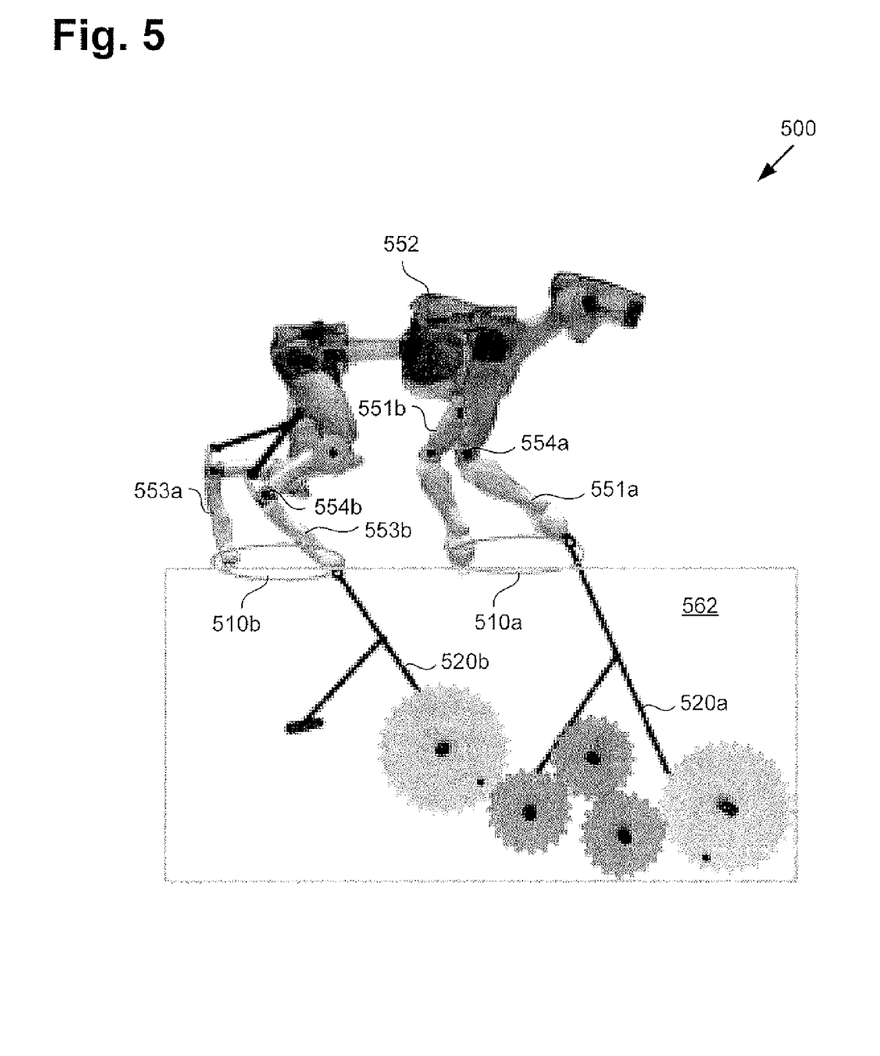
FIG. 5 shows an exemplary representation of a mechanical object at an intermediate stage of a motion-based design process, according to one implementation.

The present inventive concepts will now be further described with reference to FIGS. 4 and 5. FIG. 4 is a flowchart presenting an exemplary method for use by a design system to produce a motion-based design of a mechanical object, while FIG. 5 shows an exemplary representation of a mechanical object at an intermediate stage of the design process. FIG. 5 shows mechanical object representation 500 including articulated structure 552, shown as a quadruped having forelegs 551a and 551b, and hind legs 553a and 553b. In addition, FIG. 5 shows actuation points 554a and 554h of articulated structure 552 connected, respectively, to mechanical sub-assemblies 520a and 520b contained in gear box 562. Also shown in FIG. 5 are motion curves 510a and 510b associated with movement by articulated structure 552. With respect to the method outlined in FIG. 4, it is noted that certain details and features have been left out of flowchart 400 in order not to obscure the discussion of the inventive features in the present application.

Referring to FIG. 4 in combination with FIGS. 1 and 5, flowchart 400 begins with identifying first motion curve 510a associated with a first movement by articulated structure 552 corresponding to a mechanical object under design (410). As shown in FIG. 5, first motion curve 510a corresponds to a desired movement of foreleg 551a by articulated structure 552. According to the design system implementation shown in FIG. 1, first motion curve 510a can be identified by motion-based design engine 112 of design system 102 based on one or more inputs received by design system 102 over communications network 105. For example, designer 142, who may be a consumer or other novice or non-expert user, may utilize design terminal 132 to provide design inputs to design system 102 enabling motion-based design engine 112 to identify first motion curve 510a. Examples of design inputs received by motion-based design engine 112 of design system 102 may include selection or identification of articulated structure 552 and/or selection or determination of first motion curve 510a.

In some implementations, design inputs received by motion-based design engine 112 may also include identification of one or more actuation points, such as actuation point 554a, associated with the desired movement of foreleg 551a. However, in other implementations, motion-based design engine 112 may be configured to identify actuation point 554a automatically, based, for example, on articulated structure 552 and/or one or more parameters of motion curve 510a. In some implementations, particularly those seeking to enable motion-based design by novice users, movement of the mechanical object under design may be restricted to cyclic motions. Moreover, in such implementations, the types of mechanical objects eligible for motion-based design may be limited to mechanical objects that do not need to sense or respond to their physical environment.

Flowchart 400 continues with mapping first motion curve 510a to first mechanical sub-assembly 520a based on a previously characterized trajectory of first mechanical sub-assembly 520a (420). In some implementations, as discussed in greater detail below, first mechanical sub-assembly 520a may have one or more adjustable parameters. The mapping of first motion curve 510a to first mechanical sub-assembly 520a may be performed by motion-based design engine 112, using mechanical sub-assembly database 116. Mechanical sub-assembly database 116 is a resource having stored within it a pre-characterized or pre-computed trajectory for each mechanical sub-assembly entry in mechanical sub-assembly database 116. Motion-based design engine 112 may be configured to search mechanical sub-assembly database 116 for trajectories suitable for use as curves, or as starting curves, for substantial replication of first motion curve 510a.

The mechanical sub-assemblies in mechanical sub-assembly database typically trace out planar, closed curves or trajectories that may be represented by polygons. In order to find mechanical sub-assembly 520a that can best approximate first motion curve 510a from mechanical sub-assembly database 116, the similarity between each of the respective trajectories produced by the sub-assemblies in sub-assembly database 116 and first motion curve 510a can be determined. It is unlikely that a single parameter metric is sufficient to reflect similarity as perceived by user 142 across a broad range of possible trajectories. However, manually selecting coefficients for multi-parameter metrics is very difficult.

The present solution adopts a more user-centered approach. For example, the respective trajectories of the mechanical sub-assemblies may be converted into feature vectors that capture significant characteristics such as length, curvature, area and the like. A trajectory or curve metric can then be formulated as a bilinear form on differences in feature vectors, and may have its coefficients optimized based on data generated by user 142. Such an approach is described in detail in section 5 "Curve Metric" of pending Provisional Patent Application Ser. No. 61/815, 173, filed Apr. 23, 2013, and titled "Computational Design of Mechanical Automata." As noted above, the entire disclosure of this pending provisional application is incorporated fully by reference into the present application.

It is noted that any one pre-characterized trajectory associated with a mechanical sub-assembly entry in mechanical sub-assembly database 116 may only approximately correlate to first motion curve 510a. As a result, motion-based design engine 112 may be configured to map first motion curve 510a to one or more candidate first mechanical assemblies 520a based on one or more matching criteria. For example, in some implementations, motion-based design engine 112 may be configured to map first motion curve 510a to a single mechanical sub-assembly 520a if the correlation between the pre-characterized trajectory and first motion curve 510a is sufficiently high. In some implementations, motion-based design engine 112 may be configured to map first motion curve 510a to a group of candidate mechanical sub-assemblies, either as a default, or when the correlation between the pre-characterized trajectory of any one mechanical sub-assembly and first motion curve 510a is below a threshold correlation level.

In some implementations, the present method may include providing mechanical sub-assembly database 116 as part of design system 102. Moreover, in some implementations, the present method may include pre-computation of the trajectories associated with the mechanical sub-assemblies entered in mechanical sub-assembly database 116. In those latter implementations, pre-computation of the trajectories associated with the mechanical sub-assemblies entered in mechanical sub-assembly database 116 may be performed by motion-based design engine 112. That is to say, in some implementations, motion-based design engine 112 may be configured to create mechanical sub-assembly database 116. A process for creating mechanical sub-assembly database 116 is described in detail in section 4.1 "Parameter Space Exploration" of pending Provisional Patent Application Ser. No. 61/815,173, filed Apr. 23, 2013, and titled "Computational Design of Mechanical Automata." As noted above, the entire disclosure of this pending provisional application is incorporated fully by reference into the present application.

Flowchart 400 continues with utilizing first mechanical sub-assembly 520a to substantially replicate first motion curve 510a (430). In implementations in which first mechanical sub-assembly 520a has one or more adjustable parameters, the present method may include utilizing a continuous optimization process to tune the one or more adjustable parameters. The continuous optimization process utilized to tune the adjustable parameter(s) of mechanical sub-assembly 520a may be performed by motion-based design engine 112. That continuous optimization process may be used to alter or tune the trajectory of mechanical sub-assembly 520a to produce a tuned trajectory substantially replicating motion curve 510a.

For example, motion-based design engine 112 may be configured to use a standard Newton-Raphson method to compute the state "$s_t$" of mechanical sub-assembly 520a at phase "t" of an input driver controlling mechanical sub-assembly 520a for a particular set of adjustable parameters "p", where "t" parameterizes the phase of the input driver such that when t=1 a full movement cycle of mechanical sub-assembly 520a has been completed. As used herein, the feature referred to as a "state" can be distinguished from the features referred to as "parameters" in the following way: Considering a simple linkage of a mechanical sub-assembly as an example, its "parameters" may include the length(s) of its bar(s) and the relative position(s) of the interconnection(s), or joint(s), between them. By contrast, the "state" of the mechanical sub-assembly is a description of the configuration that it assumes under a certain input value (i.e., a certain value for "t"). For example, the configuration can be described by the set of angles formed by each pair of joining bars.

An objective function integrating the difference between a position of a designated marker point on mechanical sub-assembly 520a with its target position for the set of parameters "p" and state "$s_t$" over an entire phase "t" can then be minimized to determine the optimum adjustable parameter values for substantially replicating motion curve 510a.

As a specific example, the objective function "F" may be expressed as:

$$F = \frac{1}{2}\int_0^1 (x(p, s_t) - \hat{x}_t)^T(x(p, s_t) - \hat{x}_t)dt$$

where $x(p, s_t)$ is the position of the marker point at phase "t", and "$\hat{x}_t$" is its target position at phase "t", for parameters "p" and state "$s_t$". Minimizing this objective function can yield the optimized adjustable parameter values for substantially replicating motion curve 510a.

Examples of adjustable parameters may include the size of components used in mechanical sub-assembly 520a, such as gears and linkages, as well as their attachment points within mechanical sub-assembly 520a. For instance, a particular gear may include adjustable parameters corresponding respectively to its shape, e.g., circular or non-circular, radius, and number of teeth. A mechanical sub-assembly may have numerous adjustable parameters, such as approximately six to approximately twelve adjustable parameters, for example, or more.

Flowchart 400 continues with identifying (410) and mapping (420) second mechanical sub-assembly 520b so as to substantially replicate (430) second motion curve 510b (440). The identifying (410), mapping (420), and replicating (430) can be performed by motion-based design engine 112, as described above, and may be repeated as often as necessary or desired for substantial replication of all motion curves associated with movement by articulated structure 552.

Flowchart 400 then continues with virtually assembling the first and second mechanical sub-assemblies 520a and 520b to verify their operational compatibility (450). Such virtual assembly may be performed by motion-based design engine 112 and assures that there are no collisions or mechanical interference amongst the components of mechanical sub-assemblies 520a and 520b throughout their respective ranges of operational motion. In some implementations, mechanical sub-assemblies 520a and 520b may be operationally coupled so that a single input driver can be used to control both of mechanical sub-assemblies 520a and 520b concurrently. However, in some implementations, it may be advantageous or desirable to selectively couple mechanical sub-assemblies so that some, but not all, mechanical sub-assemblies are controlled by a common input driver.

According to the implementation shown in FIG. 5, mechanical sub-assemblies 520a and 520b for substantially replicating respective motion curves 510a and 510b are implemented in external gear box 562. However, that depiction is merely exemplary, and in other implementations, the mechanical sub-assemblies used to produce movement by the mechanical object corresponding to articulated structure 552 can be contained within the body of the mechanical object itself.

Flowchart 400 continues with simulating execution of the movements by the mechanical object to which articulated structure 552 corresponds (460). Such a simulation may be performed by motion-based design engine 112 to verify that the mechanical object under design can be operated by mechanical sub-assemblies 520a and 520b to perform the first movement represented by first motion curve 510a and the second movement represented by second motion curve 510b.

In some implementations, the present method may also include design of a support structure for the mechanical object. For example, referring to FIG. 5, in implementations in which mechanical sub-assemblies 520a and 520b are to be contained in external gear box 562, the dimensions and internal fill of gear box 562 can be determined so as to provide mechanical support for mechanical sub-assemblies 520a and 520b while enabling their entire ranges of operational motion. Moreover, in some implementations, the present method may include design of a support structure that not only holds all mechanical sub-assemblies in place, but automatically adjusts the positions of those mechanical sub-assemblies if trajectory intersections or collisions are detected. Such an approach is described in detail in section 6.2 "Layering" and section 6.3 "Support Structure" of pending Provisional Patent Application Ser. No. 61/815,173, filed Apr. 23, 2013, and titled "Computational Design of Mechanical Automata." As noted above, the entire disclosure of this pending provisional application is incorporated fully by reference into the present application.

Referring to FIG. 2 in conjunction with FIGS. 1 and 4, flowchart 400 may conclude with sending motion-based design 214a of the mechanical object to fabrication system 222/122 for fabrication. As shown by FIG. 2, motion-based design 214a may be produced by motion-based design engine 212, and may be sent or transmitted to fabrication system 222 over communication link 207, to reside in memory 226 of fabrication system 222 as motion-based design 214b. However, as noted above, in some implementations, design system 102/202 may include fabrication system 222. In those implementations, the method outlined by flowchart 400 may conclude with fabricating the mechanical object using motion-based design 214b.

Thus, the present application discloses an improved mechanical design solution that adopts a motion-based design approach for producing mechanical objects capable of relatively complex and sophisticated movement. As described above, the present solution is interactive, intuitive, and may be substantially automated through use of a motion-based design engine. As a result, some implementations advantageously enable a non-expert user, such as a lay person or consumer, to design mechanical objects capable of a wide range of movements.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

What is claimed is:

1. A method for use by a design system to produce a motion-based design of a mechanical object, the design system including a system processor and a system memory, the system memory having stored therein a motion-based design engine and a mechanical sub-assembly database including a plurality of mechanical sub-assemblies, the method comprising:
   identifying, by the motion-based design engine being executed by the system processor, a first motion curve associated with a first movement by an articulated structure corresponding to the mechanical object;
   selecting, by the motion-based design engine being executed by the system processor, a first mechanical sub-assembly from the plurality of mechanical sub-assemblies in the mechanical sub-assembly database, wherein each of the plurality of mechanical sub-assemblies stored in the mechanical sub-assembly database has a corresponding previously characterized trajectory stored in the mechanical sub-assembly database, and wherein the selecting of the first mechanical sub-assembly is based on matching the first motion curve with the previously characterized trajectory corresponding to the first mechanical sub-assembly; and
   utilizing the first mechanical sub-assembly to substantially replicate the first motion curve.

2. The method of claim 1, further comprising:
   selecting, by the motion-based design engine being executed by the system processor, a second mechanical sub-assembly from the plurality of mechanical sub-assemblies in the mechanical sub-assembly database based on matching the first motion curve with the previously characterized trajectory corresponding to the second mechanical sub-assembly; and
   utilizing the first mechanical sub-assembly and the second mechanical sub-assembly to substantially replicate the first motion curve.

3. The method of claim 1, further comprising creating the mechanical sub-assembly database.

4. The method of claim 1, further comprising:
   identifying at least one actuation point of the articulated structure, the at least one actuation point being associated with the first movement.

5. The method of claim 1, further comprising simulating execution of the first movement by the mechanical object.

6. The method of claim 1, further comprising sending the motion-based design of the mechanical object to a fabrication system.

7. The method of claim 1, further comprising fabricating the mechanical object using the motion-based design.

8. The method of claim 1, wherein selecting the first mechanical sub-assembly comprises utilizing a curve metric formulated as a bilinear form on differences in feature vectors characterizing the first mechanical sub-assembly.

9. The method of claim 1, further comprising:
   identifying, by the motion-based design engine being executed by the system processor, a second motion curve associated with a second movement by the articulated structure;
   selecting, by the motion-based design engine being executed by the system processor, a second mechanical sub-assembly from the plurality of mechanical sub-assemblies in the mechanical sub-assembly database based on matching the second motion curve with the previously characterized trajectory corresponding to the second mechanical sub-assembly;
   utilizing the second mechanical sub-assembly to substantially replicate the second motion curve; and
   virtually assembling the first and second mechanical sub-assemblies to verify operational compatibility of the first and second mechanical sub-assemblies.

10. The method of claim 1, wherein the first mechanical sub-assembly has at least one adjustable parameter, the method further comprising utilizing a continuous optimization process to tune the at least one adjustable parameter of the first mechanical sub-assembly to substantially replicate the first motion curve.

11. The method of claim 10, further comprising:
identifying, by the motion-based design engine being executed by the system processor, a second motion curve associated with a second movement by the articulated structure;
selecting, by the motion-based design engine being executed by the system processor, a second mechanical sub-assembly from the plurality of mechanical sub-assemblies in the mechanical sub-assembly database based on matching the second motion curve with the previously characterized trajectory corresponding to the second mechanical sub-assembly;
utilizing the continuous optimization process to tune at least one adjustable parameter of the second mechanical sub-assembly to substantially replicate the second motion curve; and
virtually assembling the first and second mechanical sub-assemblies to verify operational compatibility of the first and second mechanical sub-assemblies.

12. A design system configured to produce a motion-based design of a mechanical object, the design system comprising:
a system processor and a system memory having stored therein a motion-based design engine and a mechanical sub-assembly database including a plurality of mechanical sub-assemblies each having a corresponding previously characterized trajectory;
the motion-based design engine, under control of the system processor, configured to:
identify a first motion curve associated with a first movement by an articulated structure corresponding to the mechanical object;
select a first mechanical sub-assembly from the plurality of mechanical sub-assemblies in the mechanical sub-assembly database based on matching the first motion curve with the previously characterized trajectory corresponding to the first mechanical sub-assembly; and
utilize the first mechanical sub-assembly to substantially replicate the first motion curve.

13. The design system of claim 12, wherein the motion-based design engine is further configured to:
select a second mechanical sub-assembly from the plurality of mechanical sub-assemblies in the mechanical sub-assembly database based on matching the first motion curve with the previously characterized trajectory corresponding to the second mechanical sub-assembly; and
utilize the first mechanical sub-assembly and the second mechanical sub-assembly to substantially replicate the first motion curve.

14. The design system of claim 12, wherein the motion-based design engine is further configured to identify at least one actuation point of the articulated structure, the at least one actuation point being associated with the first movement.

15. The design system of claim 12, wherein the motion-based design engine is further configured to simulate execution of the first movement by the mechanical object.

16. The design system of claim 12, wherein the motion-based design engine is further configured to:
identify a second motion curve associated with a second movement by the articulated structure;
select a second mechanical sub-assembly from the plurality of mechanical sub-assemblies in the mechanical sub-assembly database based on matching the second motion curve with the previously characterized trajectory corresponding to the second mechanical sub-assembly;
utilize the second mechanical sub-assembly to substantially replicate the second motion curve; and
virtually assemble the first and second mechanical sub-assemblies to verify operational compatibility of the first and second mechanical sub-assemblies.

17. The design system of claim 12, further comprising a fabrication system for fabricating the mechanical object using the motion-based design.

18. The design system of claim 12, further comprising a three-dimensional (3D) printer for fabricating the mechanical object using the motion-based design.

19. The design system of claim 12, wherein the first mechanical sub-assembly has at least one adjustable parameter, the motion-based design engine being further configured to utilize a continuous optimization process to tune the at least one adjustable parameter of the first mechanical sub-assembly to substantially replicate the first motion curve.

20. The design system of claim 19, wherein the motion-based design engine is further configured to:
identify a second motion curve associated with a second movement by the articulated structure;
select a second mechanical sub-assembly from the plurality of mechanical sub-assemblies in the mechanical sub-assembly database based on matching the second motion curve with the previously characterized trajectory corresponding to the second mechanical sub-assembly;
utilize the continuous optimization process to tune at least one adjustable parameter of the second mechanical sub-assembly to substantially replicate the second motion curve; and
virtually assemble the first and second mechanical sub-assemblies to verify operational compatibility of the first and second mechanical sub-assemblies.

21. A non-transitory machine-readable storage medium comprising:
a mechanical sub-assembly database including a plurality of mechanical sub-assemblies each having a corresponding previously characterized trajectory stored in the mechanical sub-assembly database;
instructions, which when executed by a processor, instantiate a motion-based design engine to:
identify a first motion curve associated with a first movement by an articulated structure corresponding to the mechanical object;
select a first mechanical sub-assembly from the plurality of mechanical sub-assemblies, based on matching the first motion curve with the previously characterized trajectory corresponding to the first mechanical sub-assembly; and
utilize the first mechanical sub-assembly to substantially replicate the first motion curve.

22. The non-transitory machine-readable storage medium of claim 21, wherein the motion-based design engine instantiated by the instructions stored thereon is further configured to identify at least one actuation point of the articulated structure, the at least one actuation point being associated with the first movement.

23. The non-transitory machine-readable storage medium of claim 21, wherein the motion-based design engine instantiated by the instructions stored thereon is further configured to simulate execution of the first movement by the mechanical object.

24. The non-transitory machine-readable storage medium of claim 21, wherein the motion-based design engine instantiated by the instructions stored thereon is further configured to:
  identify a second motion curve associated with a second movement by the articulated structure;
  select a second mechanical sub-assembly from the plurality of mechanical sub-assemblies in the mechanical sub-assembly database based on matching the second motion curve with the previously characterized trajectory corresponding to the second mechanical sub-assembly;
  utilize the second mechanical sub-assembly to substantially replicate the second motion curve; and
  virtually assemble the first and second mechanical sub-assemblies to verify operational compatibility of the first and second mechanical sub-assemblies.

25. The non-transitory machine-readable storage medium of claim 21, wherein the motion-based design engine instantiated by execution of the instructions stored thereon is further configured to send the motion-based design of the mechanical object to a fabrication system for fabricating the mechanical object.

26. The non-transitory machine-readable storage medium of claim 21, wherein the first mechanical sub-assembly has at least one adjustable parameter, the motion-based design engine being further configured to utilize a continuous optimization process to tune the at least one adjustable parameter of the first mechanical sub-assembly to substantially replicate the first motion curve.

27. The non-transitory machine-readable storage medium of claim 26, wherein the motion-based design engine is further configured to:
  identify a second motion curve associated with a second movement by the articulated structure;
  select a second mechanical sub-assembly from the plurality of mechanical sub-assemblies in the mechanical sub-assembly database based on matching the second motion curve with the previously characterized trajectory corresponding to the second mechanical sub-assembly;
  utilize the continuous optimization process to tune at least one adjustable parameter of the second mechanical sub-assembly to substantially replicate the second motion curve; and
  virtually assemble the first and second mechanical sub-assemblies to verify operational compatibility of the first and second mechanical sub-assemblies.

* * * * *